US012772576B2

(12) United States Patent
Shim et al.

(10) Patent No.: US 12,772,576 B2
(45) Date of Patent: Oct. 20, 2026

(54) SOLAR CELL

(71) Applicant: SHANGRAO XINYUAN YUEDONG TECHNOLOGY DEVELOPMENT CO. LTD, Jiangxi Province (CN)

(72) Inventors: Goohwan Shim, Seoul (KR); Youngsung Yang, Seoul (KR)

(73) Assignee: JINGAO SOLAR CO., LTD, Xingtai City (CN)

( * ) Notice: Subject to any disclaimer, the term of this patent is extended or adjusted under 35 U.S.C. 154(b) by 809 days.

(21) Appl. No.: 17/299,594

(22) PCT Filed: Apr. 12, 2019

(86) PCT No.: PCT/KR2019/004399
§ 371 (c)(1),
(2) Date: Dec. 9, 2021

(87) PCT Pub. No.: WO2020/116722
PCT Pub. Date: Jun. 11, 2020

(65) Prior Publication Data
US 2022/0109077 A1 Apr. 7, 2022

(30) Foreign Application Priority Data
Dec. 3, 2018 (KR) ........................ 10-2018-0153893

(51) Int. Cl.
*H10F 19/40* (2025.01)
*H10F 19/80* (2025.01)
(Continued)

(52) U.S. Cl.
CPC ............. *H10F 19/40* (2025.01); *H10F 19/80* (2025.01); *H10F 71/00* (2025.01); *H10F 77/244* (2025.01);
(Continued)

(58) Field of Classification Search
CPC ..... H01L 31/076; H01L 31/18; H01L 31/048; H01L 31/022466; H01L 31/1864; H01L 31/043; H01L 21/324; H10K 30/57
See application file for complete search history.

(56) References Cited

U.S. PATENT DOCUMENTS

2014/0285736 A1* 9/2014 Choi ........................ G06F 3/041 174/250
2014/0363918 A1* 12/2014 Cheng .................... H01L 31/186 250/454.11
(Continued)

FOREIGN PATENT DOCUMENTS

CN 105244442 * 1/2016 ............. H10K 30/87
EP 2747101 6/2014
(Continued)

OTHER PUBLICATIONS

Translation of CN105244442, pp. 1-70 (Year: 2016).*
(Continued)

*Primary Examiner* — Thanh Truc Trinh
(74) *Attorney, Agent, or Firm* — Tarolli, Sundheim, Covell & Tummino LLP

(57) ABSTRACT

The present invention relates to a method for manufacturing a solar cell, the method comprising the steps of: preparing a substrate; forming an adhesive layer on the substrate; and forming, on the adhesive layer, a perovskite solar cell having a perovskite absorption layer, wherein an optical treatment step of providing light is performed at least once between the step of preparing the substrate and the step of forming the perovskite solar cell.

8 Claims, 9 Drawing Sheets

(51) Int. Cl.
*H10F 71/00* (2025.01)
*H10F 77/20* (2025.01)
*H10K 85/50* (2023.01)
*H10P 95/90* (2026.01)
*H10F 10/172* (2025.01)
*H10K 30/15* (2023.01)
*H10K 30/50* (2023.01)

(52) U.S. Cl.
CPC ............. *H10K 85/50* (2023.02); *H10P 95/90* (2026.01); *H10F 10/172* (2025.01); *H10K 30/151* (2023.02); *H10K 30/50* (2023.02)

(56) References Cited

U.S. PATENT DOCUMENTS

| | | | | |
|---|---|---|---|---|
| 2018/0019360 | A1* | 1/2018 | Mishima ......... | H01L 31/022466 |
| 2018/0175112 | A1 | 6/2018 | Robinson et al. | |
| 2018/0217561 | A1 | 8/2018 | Isshiki et al. | |
| 2020/0176618 | A1* | 6/2020 | Ahn ................ | H01L 31/022491 |

FOREIGN PATENT DOCUMENTS

| | | | | |
|---|---|---|---|---|
| JP | 2011054837 | | 3/2011 | |
| KR | 101462107 | B1 | 11/2014 | |
| KR | 20150086199 | | 7/2015 | |
| KR | 20160096372 | | 8/2016 | |
| KR | 20180046835 | | 5/2018 | |
| KR | 101901068 | B1 | 9/2018 | |
| KR | 20180108517 | | 10/2018 | |
| WO | WO-2016198897 | A1 * | 12/2016 | ......... C23C 18/1204 |

OTHER PUBLICATIONS

KR Office Action, Request for the Submission of an Opinion, with a mailing date of Sep. 5, 2023 corresponding to application No. 10-2018-0153893.

Albrecht et al., "Monolithic perovskite/silicon-heterojunction tandem solar cells processed at low temperature," Energy & Environmental Science, Oct. 27, 2016, 9(1):81-88.

Das et al., "Low thermal budget, photonic-cured compact TiO2 layers for high-efficiency perovskite solar cells," Journal of Materials Chemistry, May 25, 2016, 4(24):9685-9690.

Extended European Search Report in European Appln. No. 19894255.9, dated Jun. 30, 2022, 14 pages.

Lavery & Ankireddy, "Rapid Processing by Intense Pulsed Light of a CH3NH3Pbl3 Perovskite Thin Film for Photovoltaics," 2016 IEEE 43$^{rd}$ PVSC, Jun. 5, 2016, pp. 238-241.

Schulze et al., "Novel Low-Temperature Process for Perovskite Solar Cells with a Mesoporous TiO2 Scaffold," ACS applied materials & interfaces, Aug. 29, 2017, 9(36):30567-3074.

Schulze et al., "Novel Low-Temperature Process for Perovskite Solar Cells with a Mesoporous TiO2 Scaffold," ACS applied materials & interfaces, "Supporting Information," Sep. 2017, 9(36):S1-S8.

* cited by examiner

SOLAR CELL

TECHNICAL FIELD

The present disclosure relates to a solar cell, and more particularly, to a solar cell including a perovskite solar cell having a perovskite absorption layer.

BACKGROUND ART

A crystalline silicon (c-Si) solar cell is a representative single junction solar cell and has dominated the solar cell market for decades.

Recently, a new solar cell using a material having a perovskite crystal structure in a form of a mixture of inorganic matter and organic matter as a light absorber is attracting attention. In particular, a perovskite solar cell has an advantage of having a high photoelectric conversion efficiency comparable to that of a silicon solar cell, being made of a relatively inexpensive material, and capable of being formed in a low temperature process of 200° C. or lower thereby reducing manufacturing cost.

However, since the perovskite solar cell is formed in a low-temperature process and accordingly recombination is easily occurred at an interface, light conversion efficiency may be reduced as a saturation current density $J_0$ is high. In addition, even when forming an electrode, as a low-temperature process using a low-temperature paste is performed to prevent damage to a perovskite absorption layer, which is vulnerable to heat, and the electrode gets to have a low conductivity, series resistance Rse of the electrode may be decreased and thus a light conversion efficiency may be reduced.

With this reason, the present disclosure proposes a method for manufacturing a solar cell capable of improving saturation current density $J_0$ and series resistance Rse of an electrode in a perovskite solar cell having a perovskite absorption layer.

DETAILED DESCRIPTION OF THE DISCLOSURE

Technical Problem

An aspect of the present disclosure is to provide a method for manufacturing a solar cell having an improved saturation current density $J_0$ in a perovskite solar cell including a perovskite absorption layer.

In addition, an aspect of the present disclosure is to provide a method for manufacturing a solar cell having an improved series resistance Rse in a perovskite solar cell including a perovskite absorption layer.

In addition, an aspect of the present disclosure is to provide a method for manufacturing a solar cell with improved efficiency by providing a photoelectric transducer including an amorphous semiconductor layer on a rear surface of a perovskite solar cell including a perovskite absorption layer.

Technical Solution

In order to solve the above problems, in a method for manufacturing a solar cell, the method includes steps of: preparing a substrate; forming an adhesive layer on the substrate; and forming, on the adhesive layer, a perovskite solar cell having a perovskite absorption layer, wherein an optical treatment step of providing light is performed at least once between the step of preparing the substrate and the step of forming the perovskite solar cell.

Here, the optical treatment step is provided to reduce defects in the substrate, adhesive layer, or perovskite solar cell, and improve passivation performance at an interface to improve saturation current density $J_0$.

In one embodiment, the optical treatment step includes a heat treatment to provide heat. In detail, a temperature of the heat treatment is in a range of 100 to 300° C., and the optical treatment step and the heat treatment are performed for 5 to 30 minutes. Accordingly, an effect of the optical treatment step may be further improved.

In one embodiment, a method for manufacturing a solar cell includes steps of preparing a substrate, an optical treatment, forming an adhesive layer on the substrate, and forming, on the adhesive layer, a perovskite solar cell having a perovskite absorption layer that are sequentially performed.

In one embodiment, a method for manufacturing a solar cell includes steps of preparing a substrate, forming an adhesive layer on the substrate, an optical treatment, and forming, on the adhesive layer, a perovskite solar cell having a perovskite absorption layer that are sequentially performed.

In one embodiment, a method for manufacturing a solar cell includes steps of preparing a substrate, forming an adhesive layer on the substrate, forming, on the adhesive layer, a perovskite solar cell having a perovskite absorption layer, and an optical treatment that are sequentially performed.

In one embodiment, as the substrate disposed on a rear surface of the perovskite solar cell forms a photoelectric transducer including an amorphous semiconductor layer and is implemented as a monolithic tandem solar cell, a solar cell with improved light conversion efficiency is manufactured.

Advantageous Effects

According to a method for manufacturing a solar cell of the present disclosure, an optical treatment step of providing light is performed at least once between a step of preparing a substrate and a step of forming a perovskite solar cell to reduce defects in a substrate, adhesive layer, or perovskite solar cell, and enhance passivation performance at an interface to improve saturation current density $J_0$.

In addition, by performing an optical treatment step after forming a second electrode layer or a fourth electrode layer having a low content of glass frit and containing resin, a light sintering effect that increases an activity of a binder contained in the second electrode layer or in the fourth electrode layer is provided to improve conductivity. In other words, as a series resistance is improved by increasing a bonding force between a first electrode layer and the second electrode layer in contact with the first electrode layer or between a third electrode layer and the fourth electrode layer in contact with the third electrode layer, conductivity may be improved accordingly.

In addition, the solar cell is implemented as a monolithic tandem solar cell that is provided with a photoelectric transducer including an amorphous semiconductor layer on a rear surface of the perovskite solar cell having a perovskite absorption layer. Accordingly, the solar cell absorbs light in a short wavelength region at a front surface thereof and absorbs light in a long wavelength region at a rear surface thereof to move a threshold wavelength toward the long wavelength, and thus has improved light conversion efficiency in which an entire absorption wavelength region is widely used.

MODES FOR CARRYING OUT PREFERRED EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "portion" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

Also, an expression in which an element such as a layer, region or substrate is disposed "on" another component may be understood that the element may be disposed directly on another element or that an intermediate element may exist therebetween.

Figure 1:
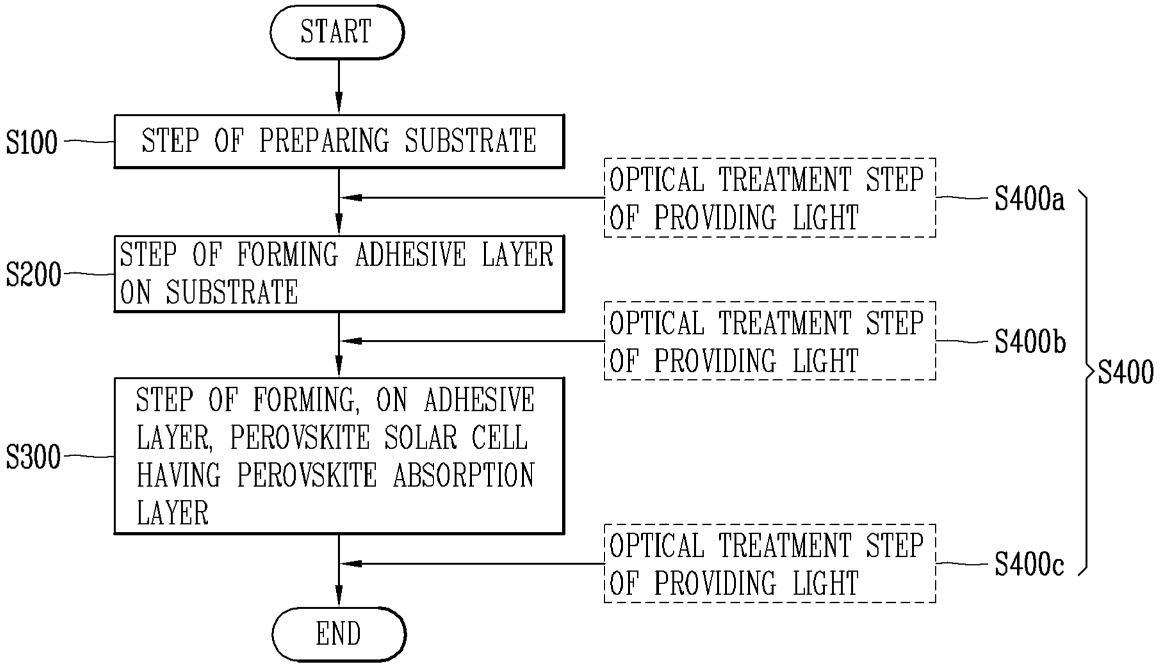
FIG. 1 is a flowchart of a method for manufacturing a solar cell of the present disclosure.

FIG. 1 is a flowchart of a method for manufacturing a solar cell of the present disclosure.

Referring to FIG. 1, a method for manufacturing a solar cell of the present disclosure includes steps of preparing a substrate [S100], forming an adhesive layer on the substrate [S200], and forming, on the adhesive layer, a perovskite solar cell having a perovskite absorption layer [S300], wherein an optical treatment step [S400] of providing light is performed at least once between the step of preparing the substrate [S100] and the step of forming the perovskite solar cell [S300].

The preparing the substrate [S100] is a step of preparing a substrate capable of supporting an adhesive layer and a perovskite solar cell, which will be described later, and there will be no limitation in selecting the substrate as long as the substrate is capable of supporting the adhesive layer and the perovskite solar cell. In one embodiment, the substrate may be at least one selected from glass, polyimide (PI), polyethylene naphthalate (PEN), and polyethylene terephthalate (PET) to implement the perovskite solar cell.

Further, the substrate may be a substrate including a photoelectric transducer including an amorphous semiconductor layer. In particular, when the photoelectric transducer is a silicon semiconductor substrate, the solar cell of the present disclosure may be implemented as a perovskite/silicon tandem solar cell. The substrate including the photoelectric transducer including the amorphous semiconductor layer may be described in detail in FIGS. 4A and 4B to be described later.

In the step of forming the adhesive layer on the substrate [S200], the adhesive layer may be disposed on the substrate. The adhesive layer is disposed on a rear surface of the perovskite solar cell, and may function as a rear electrode of the perovskite solar cell. Accordingly, the adhesive layer may be implemented using a transparent conductive oxide (TCO), a carbonaceous conductive material, a metallic material, and a conductive polymer with high electrical conductivity. According to an embodiment, the adhesive layer may have a form in which a plurality of layers is alternately stacked.

Specifically, as the transparent conductive oxide, Indium Tin Oxide (ITO), Indium Cerium Oxide (ICO), Indium Tungsten Oxide (IWO), Zinc Indium Tin Oxide (ZITO), Zinc Indium Oxide (ZIO), Zinc Tin Oxide (ZTO), Gallium Indium Tin Oxide (GITO), Gallium Indium Oxide (GIO), Gallium Zinc Oxide (GZO), Aluminum doped Zinc Oxide (AZO), Fluorine Tin Oxide (FTO), ZnO, or the like may be used. Graphene, carbon nanotubes, or fullerene (C60) may be used as the carbonaceous conductive material, and as the metallic material, a multilayer structure of a thin metal film such as metal, nanowire, and Au/Ag/Cu/Mg/Mo/Ti may be used. In addition, as the conductive polymer, polyaniline, polypyrrole, polythiophene, poly-3,4-ethylenedioxythiophene-polystyrenesulfonate (PEDOT-PSS), poly-[bis(4-phenyl)(2,4,6-Trimethylphenyl)amine] (PTAA), Spiro-MeOTAD, polyaniline-camposulfonic acid (PANICSA), or the like may be used.

Furthermore, the adhesive layer may be formed by doping n-type or p-type impurities. For example, an n-type or p-type amorphous silicon layer may be applied as the adhesive layer.

In addition, the adhesive layer may be formed in a pattern on the substrate. In particular, when the substrate includes the photoelectric transducer including the amorphous semiconductor layer, the adhesive layer may be patterned to reduce loss of light incident on the adhesive layer in order to increase an amount of light that is incident through the perovskite solar cell and incident to the photoelectric transducer including the amorphous semiconductor layer disposed on the rear surface of the perovskite solar cell.

Meanwhile, a thickness of the adhesive layer may be in a range of 20 to 40 nm. When the thickness of the adhesive layer is less than 20 nm, the adhesive layer does not have sufficient electrical conductivity, and thus it is not easy to collect electrons generated in the perovskite solar cell.

Meanwhile, when the thickness of the adhesive layer exceeds 40 nm, it has sufficient electrical conductivity, but optical loss occurs in the adhesive layer. In particular, in a case where the photoelectric transducer including the amorphous semiconductor layer (or photoelectric transducer including silicon) is disposed on the rear surface of the perovskite solar cell, light is absorbed or a reflectance is increased in the adhesive layer when the thickness of the adhesive layer exceeds 40 nm, and thus, light conversion efficiency of the perovskite/silicon tandem solar cell may decrease. The thickness of the adhesive layer may be described in detail in FIGS. 9 and 10 to be described later.

The forming the perovskite solar cell [S300] is a step of disposing the perovskite solar cell on a front surface of the adhesive layer described above. The perovskite solar cell includes the perovskite absorption layer, and the perovskite absorption layer may include a compound having a perovskite structure as a photoactive layer. The perovskite absorption layer may include at least one of organic halide perovskite and metal halide perovskite.

The perovskite may be expressed as AMX3 (where A is a monovalent organic ammonium cation or metal cation; M is a divalent metal cation; and X is a halogen anion). Non-limiting examples of compounds having a perovskite structure include $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, $(CH_3NH_3)(HC(NH_2)_2)_{1-y}PbCl_xBr_{3-x}$, or the like (0=x, y=1). In addition, a compound in which A of $AMX_3$ is partially doped with Cs may also be used. The perovskite solar cell may be described in detail in FIGS. 5A, 5B, and 6 to be described later.

Meanwhile, the optical treatment step [S400] is a step of providing light at least once between the step of preparing the substrate [S100] and the step of forming the perovskite solar cell [S300]. The optical treatment step [S400] is a step of applying energy by irradiating light to thereby improve a performance of the above-described substrate, adhesive layer, or perovskite solar cell. In detail, by providing light, a mobility of hydrogen in the substrate, adhesive layer, or perovskite solar cell is improved to increase a diffusion rate of the hydrogen.

In particular, when the substrate includes the photoelectric transducer including the amorphous semiconductor layer, an amount of hydrogen largely present in the amorphous semiconductor layer may be greatly reduced by increasing the diffusion rate of the hydrogen present therein. Furthermore, defects at an interface of each layer forming the photoelectric transducer where the amorphous semiconductor layer is included in the substrate may be reduced. In addition, conductivity of the adhesive layer may be improved through the optical treatment step [S400].

In other words, by providing light, defects in the substrate, adhesive layer, or perovskite solar cell are reduced and passivation performance at the interface is enhanced to thereby manufacture a substrate with improved saturation current density $J_0$.

In addition, in the optical treatment step [S400], a heat treatment to provide heat may be performed. In detail, the optical treatment step [S400] may be performed by additionally applying heat in a range of 100 to 300° C. Accordingly, an effect of the optical treatment step [S400] may be further improved.

A temperature at which the optical treatment is performed may be in a range of 100 to 300° C., which may vary depending on an order in which the optical treatment step [S400] is performed. The optical treatment step [S400] may be an optical treatment step [S400*a*], an optical treatment step [S400*b*], or an optical treatment step [S400*c*] as illustrated in the drawings according to the order in which the optical treatment step [S400] is performed. The optical treatment steps [S400*a*], [S400*b*], and [S400*c*] according to the order in which the optical treatment step [S400] is performed may be described in detail in FIGS. 2A to 2D to be described later.

Meanwhile, when heat is provided in the optical treatment step [S400], light source irradiation and heat treatment may be performed simultaneously. In addition, light source irradiation and heat treatment may be sequentially performed. Here, the heat treatment may be performed after the light source is irradiated, or the light source may be irradiated after the heat treatment is performed.

In the optical treatment step [S400], at least one selected from a xenon lamp, a halogen lamp, a laser, a plasma lighting system (PLS), and a light emitting diode (LED) may be used as the light source. Various light sources may be used as a non-limiting example.

A wavelength of the light source may be in a range of 300 to 1200 nm. In addition, the wavelength of the light source may include light in an ultraviolet (UV) region of less than 300 nm.

An amount of light of the light source may be adjusted by a value of a current applied to the light source and a distance between the light source and the substrate to which the light source is irradiated. In one embodiment, the light source is a white LED, and the distance between the light source and the substrate to which the light source is irradiated is adjusted to a range of 485 to 518 mm, so that the light source is irradiated with an amount of light in a range of 100 to 800 $W/m^2$.

When the amount of light is less than 100 $W/m^2$, an effect of improving saturation current density $J_0$ by an optical treatment may not be sufficient. On the other hand, when the amount of light exceeds 800 $W/m^2$, the substrate, adhesive layer, or perovskite solar cell may be deteriorated during the optical treatment step [S400] due to high light energy irradiation, and therefore, light conversion efficiency of the solar cell may be decreased.

In particular, since the perovskite solar cell is vulnerable to heat, the perovskite solar cell may be deteriorated by heat generated by an infrared region of 780 nm or above when a light source with an amount of light exceeding 800 $W/m^2$ is irradiated. In addition, when the substrate includes the photoelectric transducer including the amorphous semiconductor layer, the amorphous semiconductor layer absorbs an excessive light source and is crystallized, thereby reducing an overall efficiency of the solar cell.

Meanwhile, even with a low amount of light, an accumulated amount of energy increases as a time duration of the optical treatment step [S400] increases, and therefore, the optical treatment step [S400] may be appropriately performed by adjusting irradiation time. In one embodiment, the optical treatment step [S400] may preferably have a light irradiation time in a range of 5 to 30 minutes. When the light irradiation time is less than 5 minutes, an effect due to the optical treatment may not be sufficient. On the other hand, when the light irradiation time exceeds 30 minutes, the substrate, adhesive layer, or perovskite solar cell may be deteriorated due to an increase in the accumulated amount of applied energy, thereby reducing light conversion efficiency of the solar cell.

Furthermore, according to a variation or an embodiment described below, the same or similar reference numerals are designated to the same or similar configurations to the foregoing example, and the description thereof will be substituted by the earlier description.

FIGS. 2A to 2D are flowcharts of various embodiments in which the optical treatment steps [S400*a*], [S400*b*], and [S400*c*] are performed in different orders in the method for manufacturing the solar cell of the present disclosure.

Figure 2A:
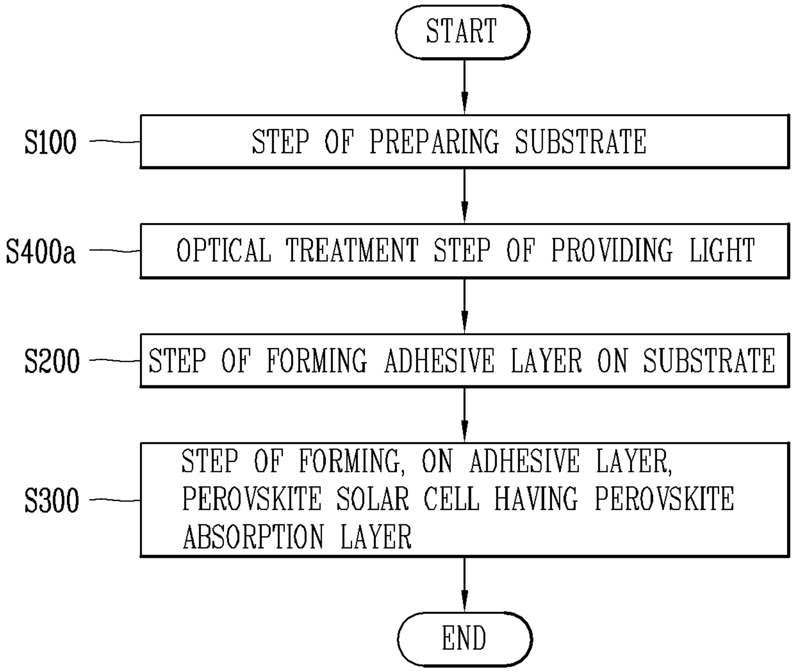
FIGS. 2A to 2D are flowcharts of various embodiments in which optical treatment steps are performed in different orders in a method for manufacturing a solar cell of the present disclosure.

Referring to FIG. 2A, in the method for manufacturing the solar cell, the steps of preparing the substrate [S100], the optical treatment [S400*a*], forming the adhesive layer on the substrate [S200], and forming, on the adhesive layer, the perovskite solar cell having the perovskite absorption layer [S300] may be sequentially performed.

In the optical treatment step [S400*a*] performed after the step of preparing the substrate [S100], bonding of an interface of the substrate may be reduced or a hydrogen diffusion rate may be increased in a layer included in the substrate. In particular, when the substrate includes the photoelectric transducer including the amorphous semiconductor layer, an amount of hydrogen largely present in the amorphous semiconductor layer may be greatly reduced by increasing the diffusion rate of the hydrogen present therein. Furthermore, defects at an interface of each layer forming the photoelectric transducer where the amorphous semiconductor layer is included in the substrate may be reduced.

In other words, as hydrogen reactivity inside the amorphous semiconductor layer is increased by light or heat provided in the optical treatment step [S400*a*], deterioration that may occur in the photoelectric transducer including the amorphous semiconductor layer may be prevented. When the substrate includes the photoelectric transducer including the amorphous semiconductor layer, thermal stability at a temperature of 200° C. or above may be ensured and saturation current density $J_0$ of the photoelectric transducer may be improved. However, when heat of 300° C. or above is irradiated to the photoelectric transducer including the amorphous semiconductor layer, the amorphous semiconductor layer is crystallized, and accordingly, light conversion efficiency of the solar cell is reduced. Therefore, when the optical treatment step [S400*a*] is performed after the step of preparing the substrate [S100], a temperature of the heat treatment performed together with the optical treatment step [S400*a*] is preferably in a range of 200 to 300° C.

Furthermore, when the substrate includes the photoelectric transducer including the amorphous semiconductor layer, conductivity of the first electrode layer containing the transparent conductive oxide and the second electrode layer containing metal that are disposed on a rear surface of the photoelectric transducer may be improved. Since the photoelectric transducer includes the amorphous semiconductor layer, there is a difficulty in performing a process at 300° C. or above. With this reason, the first electrode layer and the second electrode layer are formed at a temperature of 300° C. or less.

Meanwhile, in a case where the time duration of the light irradiation and the heat treatment exceeds 30 minutes when the optical treatment step [S400*a*] is performed after the step of preparing the substrate [S100], the substrate may be deteriorated due to an increase in the accumulated amount of energy applied by the light and heat to thereby reduce light conversion efficiency of the solar cell, and manufacturing time may be lengthened due to excessive processing time.

The optical treatment step [S400*a*] is performed to improve a bonding force between the first electrode layer and the second electrode layer, and accordingly, a series resistance between the first electrode layer and the second electrode layer is improved to thereby enhance conductivity.

In addition, since the second electrode layer containing metal has a low content of glass frit and contains resin, the second electrode layer gets to have a conductivity with conductive materials being aggregated by being brought into contact with each other not with being connected to each other by sintering. However, since the series resistance of the second electrode is improved by the light irradiation or heat treatment in the optical treatment step [S400*a*], conductivity may be improved.

Figure 2B:
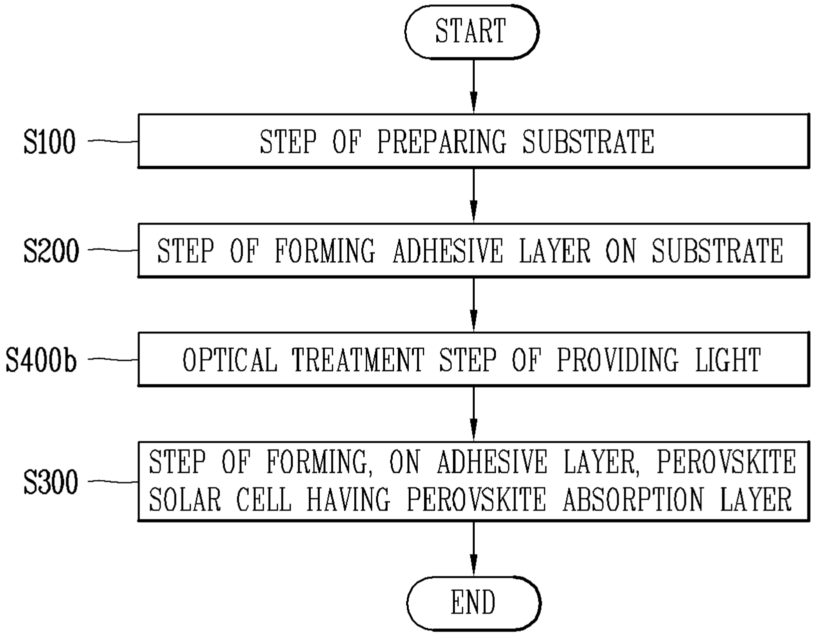

Referring to FIG. 2B, in the method for manufacturing the solar cell, the steps of preparing the substrate [S100], forming the adhesive layer on the substrate [S200], the optical treatment [S400*b*], and forming, on the adhesive layer, the perovskite solar cell having the perovskite absorption layer [S300] may be sequentially performed.

When the optical treatment step [S400*b*] is performed after the step of forming the adhesive layer on the substrate [S200], there may be an effect in which the conductivity of the adhesive layer is improved in addition to the effect in which the bonding of the interface of the substrate is reduced or the hydrogen diffusion rate is increased in the layer included in the substrate including the amorphous semiconductor layer.

A temperature of the heat treatment performed together with the optical treatment step [S400*b*] is preferably in a range of 200 to 300° C. When a temperature at the heat treatment performed together with the optical treatment step [S400*b*] is less than 200° C., it is difficult to reduce interfacial defects of the substrate or to improve the efficiency of the substrate including the amorphous semiconductor layer. On the other hand, when the temperature at the heat treatment performed together with the optical treatment step [S400*b*] exceeds 300° C., this may cause deterioration of the performance of the substrate including the amorphous semiconductor layer.

Figure 2C:
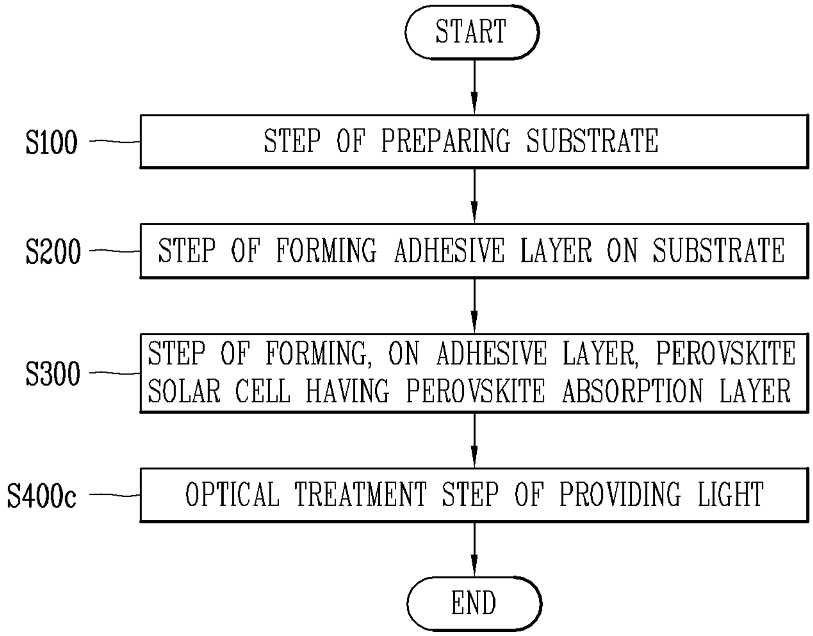

Meanwhile, in a case where the time duration of the light irradiation and the heat treatment exceeds 30 minutes when the optical treatment step [S400*a*] is performed after the step of forming the adhesive layer [S200], the substrate of the adhesive layer may be deteriorated due to an increase in the accumulated amount of energy applied by the light and heat to thereby reduce light conversion efficiency of the solar cell. Referring to FIG. 2C, in the method for manufacturing the solar cell, the steps of preparing the substrate [S100], forming the adhesive layer on the substrate [S200], forming, on the adhesive layer, the perovskite solar cell having the perovskite absorption layer [S300], and the optical treatment [S400*c*] may be sequentially performed.

In the optical treatment step [S400*c*] performed after the step of forming the perovskite solar cell [S300], defects in the substrate, adhesive layer, or perovskite solar cell are reduced and passivation performance at the interface is enhanced to thereby improve saturation current density $J_0$.

A temperature of the heat treatment performed together with the optical treatment step [S400*c*] is preferably in a range of 100 to 200° C. When the temperature of the heat treatment performed together with the optical treatment step [S400*c*] is less than 100° C., the effect of reducing defects in the substrate, adhesive layer, or perovskite solar cell and enhancing passivation performance at the interface may be insignificant. Meanwhile, since the perovskite solar cell having the perovskite absorption layer is vulnerable to heat, when the temperature at the heat treatment performed together with the optical treatment step [S400*c*] exceeds 200° C., the perovskite absorption layer may be deteriorated by the heat.

In a case where the time duration of the light irradiation and the heat treatment exceeds 10 minutes when the optical treatment step [S400*c*] is performed after the step of forming the perovskite solar cell [S300], the perovskite absorption layer may be deteriorated due to an increase in the accumulated amount of energy applied by the light and heat.

Figure 2D:
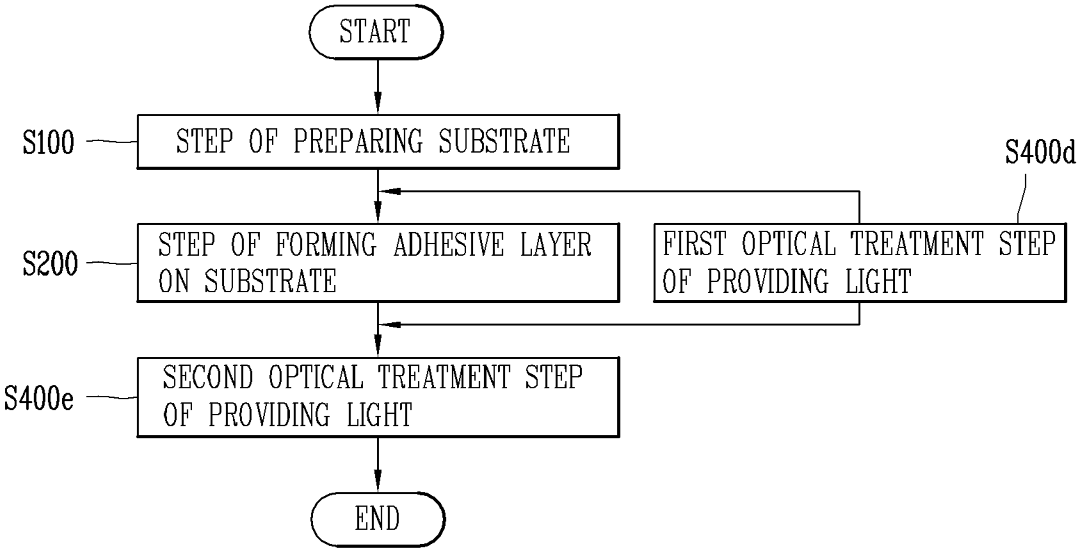

Referring to FIG. 2D, the method for manufacturing the solar cell may include a first optical treatment step [S400*d*] and a second optical treatment step [S400*e*] in which a condition of optical treatment and a condition of heat treatment are different from each other. In detail, the first optical treatment step [S400*d*] may be performed after the step of preparing the substrate [S100] or the step of forming the adhesive layer on the substrate [S200]. Meanwhile, the second optical treatment step [S400*e*] may be performed after the step of forming, on the adhesive layer, the perovskite solar cell having the perovskite absorption layer [S300].

A total accumulated amount of energy applied by the light and heat in the first optical treatment step [S400*d*] may be greater than a total accumulated amount of energy applied by the light and heat in the second optical treatment step [S400*e*]. Specifically, a temperature of the heat treatment performed together with the first optical treatment step [S400*d*] is preferably in a range of 200 to 300° C., and a time duration of the light irradiation and the heat treatment is preferably 30 minutes or less. This is due to the accumulated amount of energy applied by the light and heat during the optical treatment step [S400*d*]. Meanwhile, the temperature of the heat treatment performed together with the second optical treatment step [S400*e*] is preferably in a range of 100 to 200° C., and a time duration of the light irradiation and the heat treatment is preferably 10 minutes or less. This is due to a problem in that the perovskite absorption layer is deteriorated by an increase in the accumulated amount of energy applied by the light and heat during the optical treatment step [S400*e*].

Figure 3:
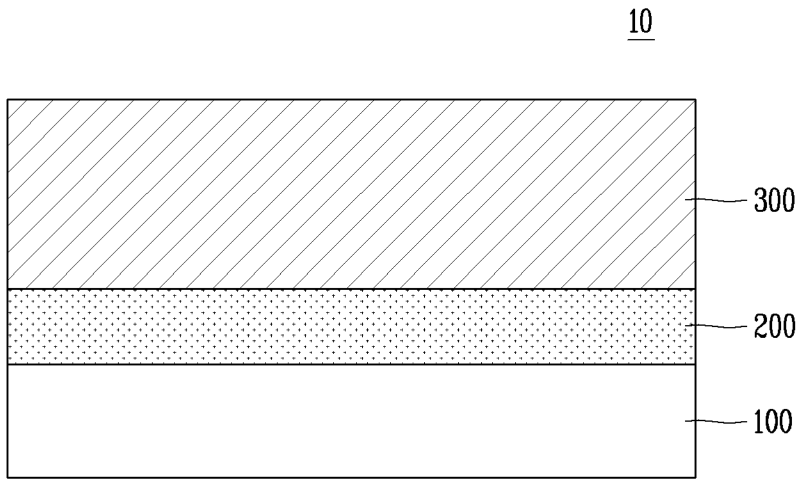
FIG. 3 is a conceptual view of a solar cell manufactured by a method for manufacturing a solar cell of the present disclosure.

FIG. 3 is a conceptual view of a solar cell 10 manufactured by the method for manufacturing the solar cell of the present disclosure.

Referring to FIG. 3, the solar cell 10 includes a substrate 100, an adhesive layer 200, and a perovskite solar cell 300 having a perovskite absorption layer.

The substrate 100 may be at least one selected from glass, polyimide (PI), polyethylene naphthalate (PEN), and polyethylene terephthalate (PET) capable of supporting the perovskite solar cell 300. The above-listed materials regarding the substrate are only exemplary, and are not limited as long as they can support the perovskite solar cell 300. Furthermore, the substrate 100 may include a photoelectric transducer including an amorphous semiconductor layer.

The adhesive layer 200 may be disposed between the substrate 100 and the perovskite solar cell 300 so as to be operated as a rear electrode of the perovskite solar cell 300. In addition, when the substrate 100 includes the photoelectric transducer including the amorphous semiconductor layer, the substrate 100 may perform a role of a tunneling film to thereby implement a perovskite/silicon tandem solar cell.

Accordingly, the adhesive layer 200 may be implemented by using a transparent conductive oxide (TCO), a carbonaceous conductive material, a metallic material, and a conductive polymer with high electrical conductivity. According to an embodiment, the adhesive layer 200 may have a form in which a plurality of layers is alternately stacked.

Furthermore, the adhesive layer may be formed by doping n-type or p-type impurities. For example, an n-type or p-type amorphous silicon layer may be applied as the adhesive layer 200.

A thickness of the adhesive layer 200 may be in a range of 20 to 40 nm. When the thickness of the adhesive layer is less than 20 nm, the adhesive layer does not have sufficient electrical conductivity, and thus it is not easy to collect electrons generated in the perovskite solar cell 300. Meanwhile, when the thickness of the adhesive layer exceeds 40 nm, the adhesive layer has sufficient electrical conductivity, but optical loss occurs in the adhesive layer.

The perovskite solar cell 300 includes the perovskite absorption layer, and the perovskite absorption layer may include a compound having a perovskite structure as a photoactive layer. The perovskite absorption layer may include at least one of organic halide perovskite and metal halide perovskite.

Figure 4A:
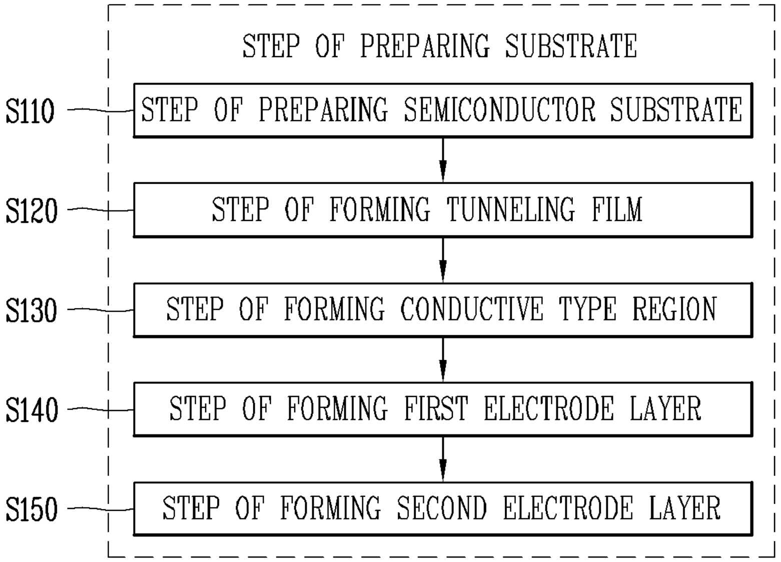
FIG. 4A is a flowchart and FIG. 4B is a conceptual view of an embodiment of a substrate of the present disclosure illustrating a method for manufacturing a photoelectric transducer including an amorphous semiconductor layer.
Figure 4B:
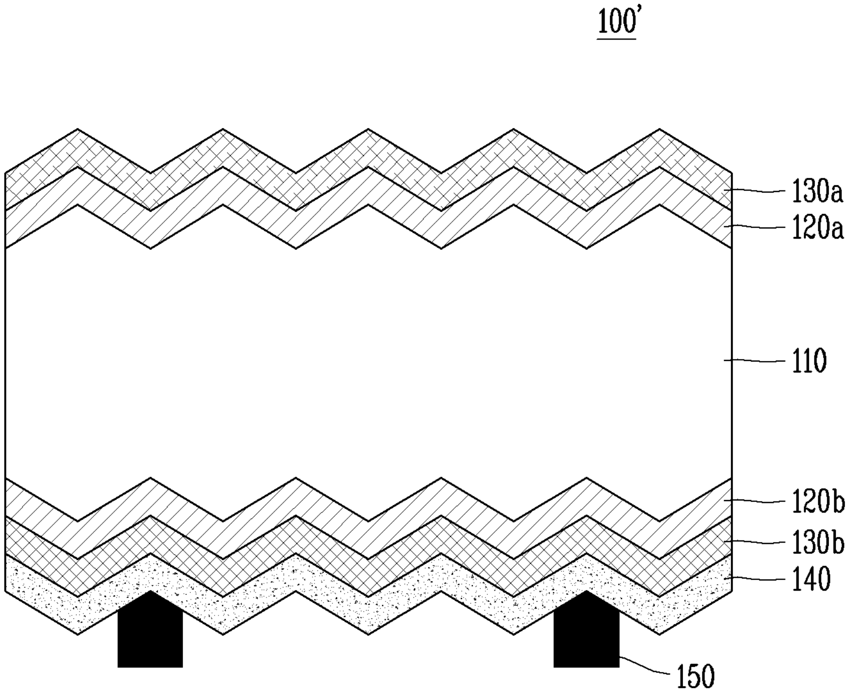

FIG. 4A is a flowchart and FIG. 4B is a conceptual view of an embodiment of a substrate of the present disclosure illustrating a method for manufacturing a photoelectric transducer 100' including an amorphous semiconductor layer.

Referring to FIGS. 4A and 4B, the method for manufacturing the photoelectric transducer 100' including the amorphous semiconductor layer includes steps of preparing a semiconductor substrate 110 [S110], forming a first tunneling film 120*a* and a second tunneling film 120*b* [S120], forming a first conductive type region 130*a* and a second conductive type region 130*b* [S130], forming a first electrode layer 140 [S140], and forming a second electrode layer 150 [S150].

The semiconductor substrate 110 may be a crystalline silicon substrate containing a dopant while having a predetermined resistivity. Furthermore, a surface of the semiconductor substrate 110 may be textured to have an unevenness. The unevenness is formed on the surface of the semiconductor substrate 110 and has a pyramid shape having with irregular size, thereby reducing reflectance of incident light and increasing a light conversion efficiency in the photoelectric transducer including the amorphous semiconductor layer. However, the surface of the semiconductor substrate 110 of the present disclosure may not be limited to having textured unevenness. The semiconductor substrate 110 may not have textured unevenness on a front surface or a rear surface thereof.

In the step of forming the first tunneling film 120*a* and the second tunneling film 120*b* [S120], the tunneling films 120*a* and 120*b* may be formed entirely on the front surface and the rear surface of the semiconductor substrate 110. In detail, the first tunneling film 120*a* may be formed on the front surface of the semiconductor substrate 110 and the second tunneling film 120*b* may be formed on the rear surface of the semiconductor substrate 110. The first tunneling film 120*a* and the second tunneling film 120*b* are formed entirely on the front surface and the rear surface of the semiconductor substrate 110 and passivated to reduce recombination at interfaces.

In addition, the first tunneling film 120*a* and the second tunneling film 120*b* act as a kind of a barrier to electrons and holes to prevent minority carriers from passing therethrough, and only a plurality of minority carriers, having a predetermined energy or more after stacked on the interfaces of the first tunneling film 120*a* and second tunneling film

120*b*, may pass through the first tunneling film 120*a* and second tunneling film 120*b*, respectively, due to the tunneling effect.

The first tunneling film 120*a* and the second tunneling film 120*b* may contain nitride, semiconductor, or conductive polymer through which carriers can be tunneled. For example, the first tunneling film 120*a* and the second tunneling film 120*b* may contain silicon oxide, silicon nitride, silicon oxynitride, i-type (or intrinsic) amorphous semiconductor (e.g., i-type amorphous silicon), i-type polycrystalline semiconductor (e.g., i-type polycrystalline silicon) or the like.

In an embodiment, the first tunneling film 120*a* and the second tunneling film 120*b* each may be implemented as an amorphous silicon (a-Si) layer, an amorphous silicon carbide (a-SiCx) layer, an amorphous silicon oxide (a-SiOx) layer or the like. In an embodiment, the first tunneling film 120*a* and the second tunneling film 120*b* each may be implemented as an i-type amorphous silicon layer. When the first tunneling film 120*a* and the second tunneling film 120*b* are each implemented as an i-type amorphous silicon layer, the first tunneling film 120*a* and the second tunneling film 120*b* may have excellent adhesion to the semiconductor substrate 110 and may have excellent electrical conductivity.

In the step of forming the first conductive type region 130*a* and the second conductive type region 130*b* [S130], a first conductive type semiconductor layer 130*a* having a first conductive type may be disposed on a front surface of the first tunneling film 120*a*. Meanwhile, a second conductive type semiconductor layer 130*b* having a second conductive type may be disposed on a rear surface of the second tunneling film 120*b*. The first conductive type semiconductor layer may be a p-type semiconductor layer containing a p-type impurity, and the second conductive type semiconductor layer may be an n-type semiconductor layer containing an n-type impurity. However, the present disclosure is not necessarily limited thereto, and an example in which the first conductive type is an n-type and the second conductive type is a p-type may also be possible. The p-type impurity may be a group 3 element such as boron (B), aluminum (Al), gallium (Ga), and indium (In), and the n-type impurity may be a group 5 element such as phosphorus (P), arsenic (As), bismuth (Bi), and antimony (Sb).

When the semiconductor substrate 110 contains a second conductive type impurity, the first conductive type semiconductor layer 130*a* has a conductive type different from that of the semiconductor substrate 110. Accordingly, the semiconductor substrate 110 and the first conductive type semiconductor layer 130*a* form a PN junction. In other words, the first conductive type semiconductor layer 130*a* forms an emitter. Meanwhile, the second conductive type semiconductor layer 130*b* has a conductive type same as that of the semiconductor substrate 110 and forms a back surface field (BSF) having a higher impurity concentration than the semiconductor substrate 110. In other words, as the first conductive type region 130*a* and the second conductive type region 130*b* facilitate a movement of the majority carrier of the photoelectric transducer 100' including the amorphous semiconductor layer, a light conversion efficiency of the photoelectric transducer 100' may be increased. However, the present disclosure is not limited thereto. When the semiconductor substrate 110 contains a first conductive type impurity, the first conductive type semiconductor layer 130*a* may form a front surface field, and the second conductive type semiconductor layer 130*b* may form an emitter region.

As the first conductive type semiconductor layer 130*a* and the second conductive type semiconductor layer 130*b* are disposed on the first tunneling film 120*a* and the second tunneling film 120*b*, a structure of the photoelectric transducer 100' including the amorphous semiconductor layer may be simplified, and the tunneling effect of the first tunneling film 120*a* and the second tunneling film 120*b* may be maximized.

The first conductive type semiconductor layer 130*a* and the second conductive type semiconductor layer 130*b* each may be selected from an amorphous silicon (a-Si) layer, an amorphous silicon carbide (a-SiCx) layer, and an amorphous silicon oxide (a-SiOx) layer. In an embodiment, when the first tunneling film 120*a* and the second tunneling film 120*b* are i-type amorphous silicon, the first conductive type semiconductor layer 130*a* and the second conductive type semiconductor layer 130*b* each may be formed of a first conductive type amorphous silicon to have excellent adhesion to the first tunneling film 120*a* and the second tunneling film 120*b*.

In the steps of forming the first electrode layer 140 [S140] and forming the second electrode layer 150 [S150], the first electrode layer 140 and the second electrode layer 150 are formed on a rear surface of the second conductive type semiconductor layer 130*b* to thereby form a passage through which carriers (electrons or holes) formed by receiving light from the photoelectric transducer 100' move to the second conductive type semiconductor layer 130*b*.

The first electrode layer 140 may be formed to cover at least a part of the rear surface of the second conductive type semiconductor layer 130*b*. Accordingly, the first electrode layer 140 may be implemented by using a transparent conductive oxide (TCO), a carbonaceous conductive material, a metallic material, and a conductive polymer with high electrical conductivity. In an embodiment, the first electrode layer 140 may be formed of Indium Tin Oxide (ITO). Further, by forming the second electrode layer 150 on a rear surface of the first electrode layer 140 of a material having an electrical conductivity higher than the first electrode layer 140, carrier collection efficiency may be improved and resistance may be reduced. Accordingly, characteristics of the photoelectric transducer 100' may be improved.

Since the first tunneling film 120*a*, the second tunneling film 120*b*, the first conductive type semiconductor layer 130*a*, and the second conductive type semiconductor layer 130*b* are formed as amorphous semiconductor layers, they are modified at a temperature exceeding 300° C. With this reason, the second electrode layer 150 may be formed at a temperature of 300° C. or less. Accordingly, the second electrode layer 150 does not contain glass frit, and thus can be easily sintered even at a low temperature. In detail, the second electrode layer 150 may contain only a conductive material and a resin (a binder, a curing agent, and an additive). The conductive material may include metal such as silver (Ag), aluminum (Al), and copper (Cu), and the resin may include a cellulose-based or phenolic-based binder, and an amine-based curing agent.

In addition, since the second electrode layer 150 containing metal has a low content of glass frit and contains resin, the second electrode layer 150 has a conductivity lower than that of an electrode formed at a high temperature with conductive materials being aggregated by being brought into contact with each other not with being connected to each other by sintering.

However, when the substrate is the photoelectric transducer 100', the substrate has a light sintering effect due to an activity of the binder contained in the second electrode layer 150 increased by the light irradiation or heat treatment in the optical treatment step [S400*a*] to thereby prevent deterioration of the amorphous semiconductor layer and improve the conductivity of the second electrode layer 150. In other words, the series resistance of the second electrode layer 150 of the photoelectric transducer 100' may be improved by the above-described optical treatment step [S400*a*].

Figure 5A:
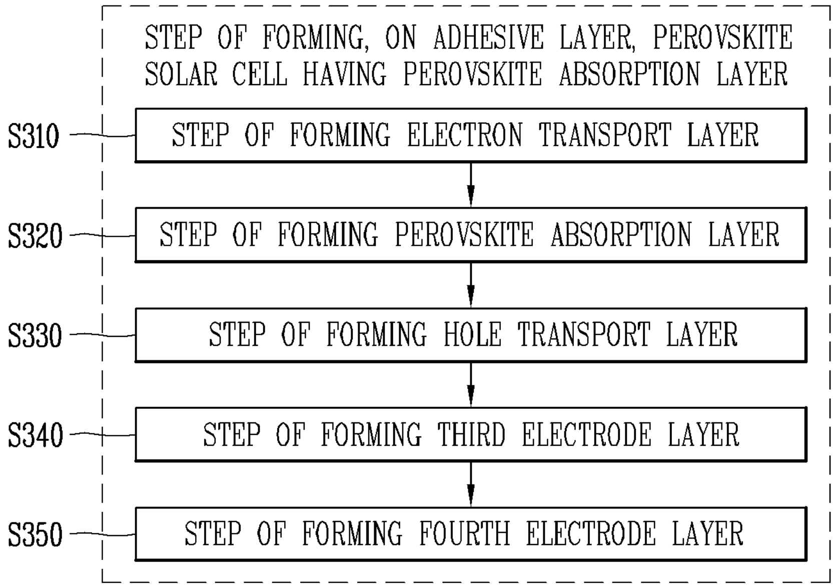
FIG. 5A is a flowchart and FIG. 5B is a conceptual view of a method for manufacturing a perovskite solar cell having a perovskite absorption layer on an adhesive layer of the present disclosure.
Figure 5B:
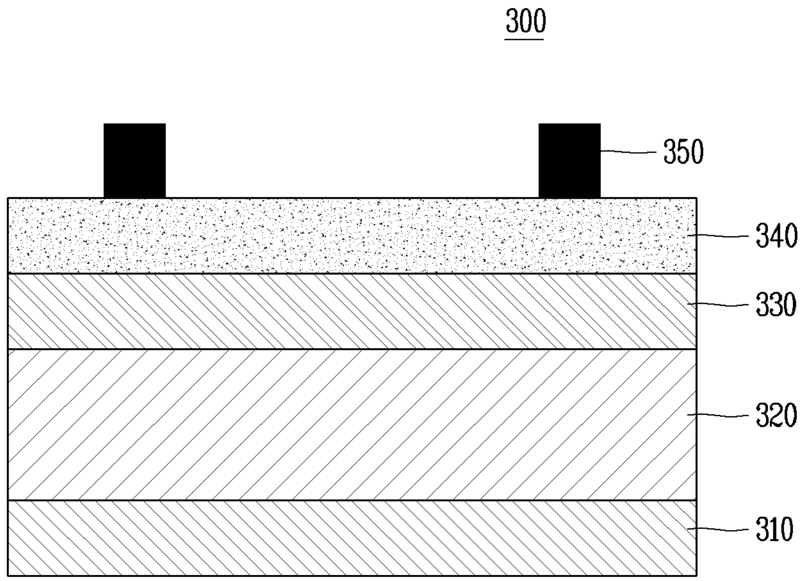

FIG. 5A is a flowchart and FIG. 5B is a conceptual view of a method for manufacturing the perovskite solar cell 300 having the perovskite absorption layer on an adhesive layer of the present disclosure.

Referring to FIGS. 5A and 5B, the perovskite solar cell 300 may be formed by sequentially stacking an electron transport layer 310, a perovskite absorption layer 320, a hole transport layer 330, a third electrode layer 340, and a fourth electrode layer 350 on an adhesive layer (not illustrated).

In detail, the method for manufacturing the perovskite solar cell 300 having the perovskite absorption layer includes steps of forming the electron transport layer 310 [S310], forming the perovskite absorption layer 320 [S320], forming the hole transport layer 330 [S330], forming the third electrode layer 340 [S340], and forming the fourth electrode layer 350 [S350].

In the step of forming the electron transport layer 310 [S310], the electron transport layer 310 is formed on a front surface of the adhesive layer (not illustrated). In the electron transport layer 310, the adhesive layer may be formed of a transparent conductive oxide (TCO), or a carbonaceous conductive material with high electrical conductivity.

Specifically, the transparent conductive oxide implementing the electron transport layer 310 may be Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, In oxide, SrTi oxide or the like. Preferably, the electron transport layer 310 may include at least one selected from ZnO, TiO2, SnO2, WO3, and TiSrO3.

Furthermore, graphene, carbon nanotubes, or fullerene (C60) may be used as the carbonaceous conductive material.

In the step of forming the perovskite absorption layer 320 [S320], the perovskite absorption layer 320 is formed on a front surface of the electron transport layer 310.

In the perovskite absorption layer 320, hole-electron pairs generated by receiving light energy from the sun may be decomposed into electrons or holes. In an embodiment, electrons formed in the perovskite absorption layer 320 may be transferred to the electron transport layer 310, and holes formed in the perovskite absorption layer 320 may be transferred to the hole transport layer 330.

The perovskite absorption layer 320 may contain an organic halide perovskite such as methyl ammonium iodide (MAI), and formamidinium iodide (FAI), or a metal halide perovskite such as lead iodide (PbI2), bromine iodide (PbBr), and lead chloride (PbCl2). In other words, the perovskite absorption layer 320 may have a multilayered structure including at least one of organic halide perovskite and metal halide perovskite. A stacked structure of the perovskite absorption layer 320 may be described in detail in FIG. 6 to be described later.

Specifically, the perovskite absorption layer 320 may be expressed as $AMX_3$ (where A is a monovalent organic ammonium cation or metal cation; M is a divalent metal cation; and X is a halogen anion). Non-limiting examples of compounds having a perovskite structure include $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)1\text{-}yPbI_xBr_{3-x}$, $(CH_3NH_3)(HC(NH_2)_2)_{1-y}PbCl_xBr_{3-x}$, or the like (0=x, y=1). In addition, a compound in which A of AMX3 is partially doped with Cs may also be used.

The perovskite absorption layer 320 may be formed by a single-step spin-coating method, a multi-step spin-coating method, a dual-source vapor deposition method, and a vapor-assisted solution process.

In the step of forming the hole transport layer 330 [S330], the hole transport layer 330 may be formed of a conductive polymer. Specifically, for the conductive polymer, polyaniline, polypyrrole, polythiophene, poly-3,4-ethylenedioxythiophene polystyrene sulfonate (PEDOT-PSS), poly-[bis(4-phenyl)(2,4,6) -Trimethylphenyl)amine] (PTAA), Spiro-MeOTAD, or polyaniline-camposulfonic acid (PANI-CSA), and the like may be used.

Positions of the electron transport layer 310 and the hole transport layer 330 disposed on a rear surface of the perovskite absorption layer 320 described above may be switched to each other as necessary.

In the step of forming the third electrode layer 340 [S340] and the step of forming the fourth electrode layer 350 [S350], the third electrode layer 340 and the fourth electrode layer 350 are formed on a front surface of the hole transport layer 330. Description of roles, materials, and shapes of the third electrode layer 340 and the fourth electrode layer 350 may be replaced by the description of the first electrode layer 140 and the second electrode layer 150. Specifically, the third electrode layer 340, similar to the first electrode layer 140, may be implemented using a transparent conductive oxide (TCO), a carbonaceous conductive material, a metallic material, and a conductive polymer with high electrical conductivity. Further, the fourth electrode layer 350, similar to the second electrode layer 150, is formed on a front surface of the third electrode layer 340 and is formed of a material having an electrical conductivity higher than the third electrode layer 340 to improve carrier collection efficiency and reduce resistance.

When the temperature of the heat treatment exceeds 150° C. in the step of forming the fourth electrode layer 350, the perovskite absorption layer may be deteriorated due to the heat. Accordingly, the fourth electrode layer 350, similar to the second electrode layer 150, does not contain glass frit, and thus can be easily sintered even at a low temperature. In detail, the fourth electrode layer 350 may contain only a conductive material and a resin (a binder, a curing agent, and an additive). In addition, since the fourth electrode layer 350 containing metal has a low content of glass frit and contains resin, the fourth electrode layer 350 has a conductivity lower than that of an electrode formed at a high temperature with conductive materials being aggregated by being brought into contact with each other not with being connected to each other by sintering.

However, the fourth electrode layer 350 has a light sintering effect due to an activity of the binder contained in the fourth electrode layer 350 increased by the light irradiation or heat treatment in the optical treatment step [S400*c*], and thus the conductivity of the fourth electrode layer 350 may be improved. In addition, by the optical treatment step [S400*c*], defects in the substrate, adhesive layer, or perovskite solar cell 300 are reduced and passivation performance at the interface is enhanced to thereby improve saturation current density $J_0$.

Figure 6:
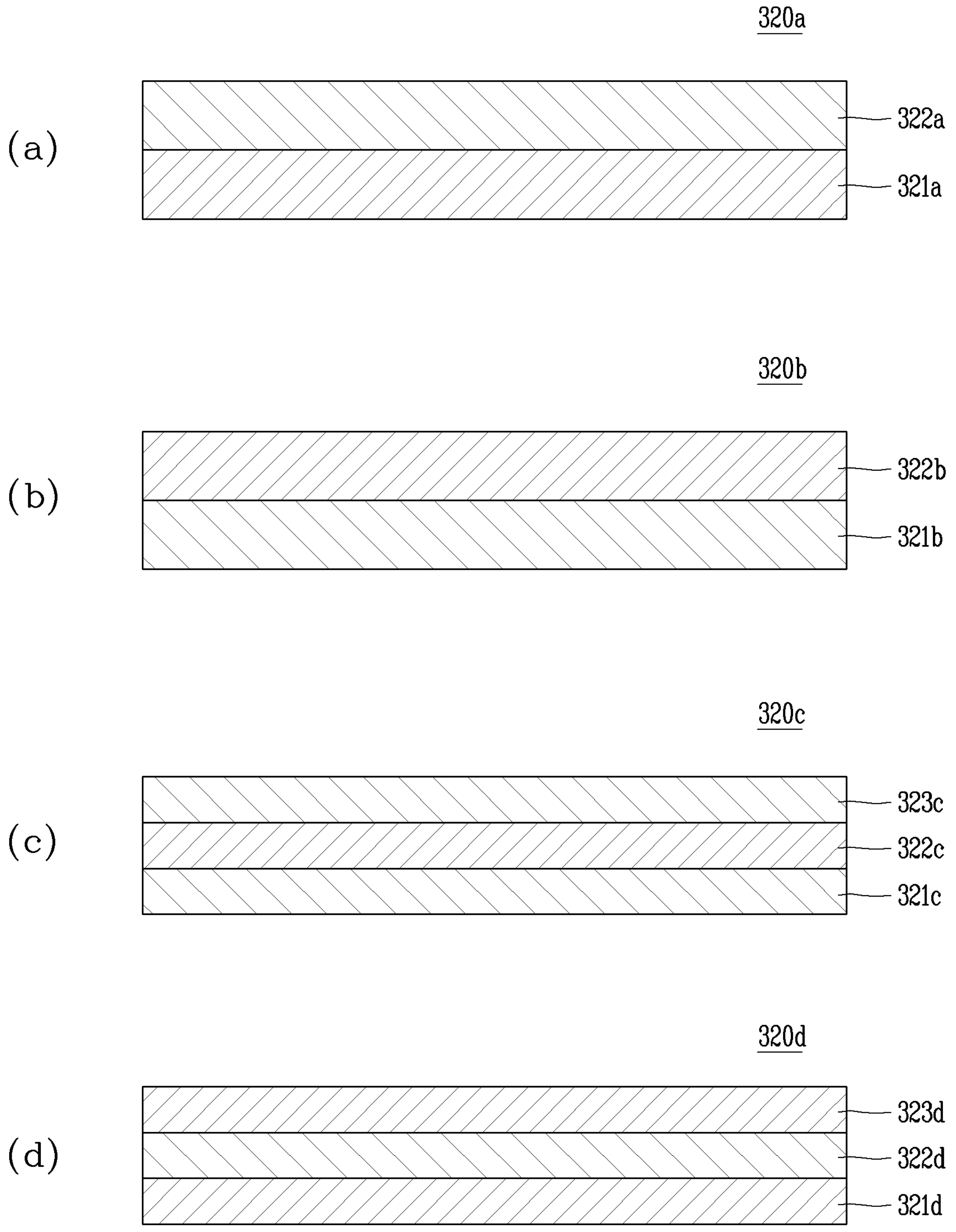
FIG. 6 is a conceptual view of a laminated structure of a perovskite absorption layer of the present disclosure.

FIG. 6 is a conceptual view of each of laminated structures of perovskite absorption layers 320*a*, 320*b*, 320*c*, and 320*d* of the present disclosure.

Referring to FIG. 6, the perovskite absorption layers 320_a_, 320_b_, 320_c_, and 320_d_ each has a multilayered structure including at least one of organic halide perovskite and metal halide perovskite.

The perovskite absorption layer 320_a_ of (a) of FIG. 6 has a double-layered structure in which a metal halide perovskite 322_a_ is stacked on a front surface of an organic halide perovskite 321_a_. Accordingly, light conversion efficiency of the solar cell including the perovskite absorption layer 320_a_ may be improved by applying a double-layered structure in which electrons and holes are formed by receiving light energy of various wavelengths.

The perovskite absorption layer 320_b_ of (b) of FIG. 6 has a double-layered structure in which an organic halide perovskite 322_b_ is stacked on a front surface of a metal halide perovskite 321_b_.

(c) and (d) of FIG. 6 are perovskite absorption layers 320_c_ and 320_d_ each having a triple-layered structure including organic halide perovskite or metal halide perovskite. The perovskite absorption layers 320_c_ and 320_d_ each has a sandwich structure. In detail, the perovskite absorption layer 320_c_ has a triple-layered structure in which an organic halide perovskite 322_c_ is disposed between metal halide perovskites 321_c_ and 323_c_. In addition, the perovskite absorption layer 320_d_ has a triple-layered structure in which a metal halide perovskite 322_d_ is disposed between organic halide perovskites 321_d_ and 323_d_.

Figure 7:
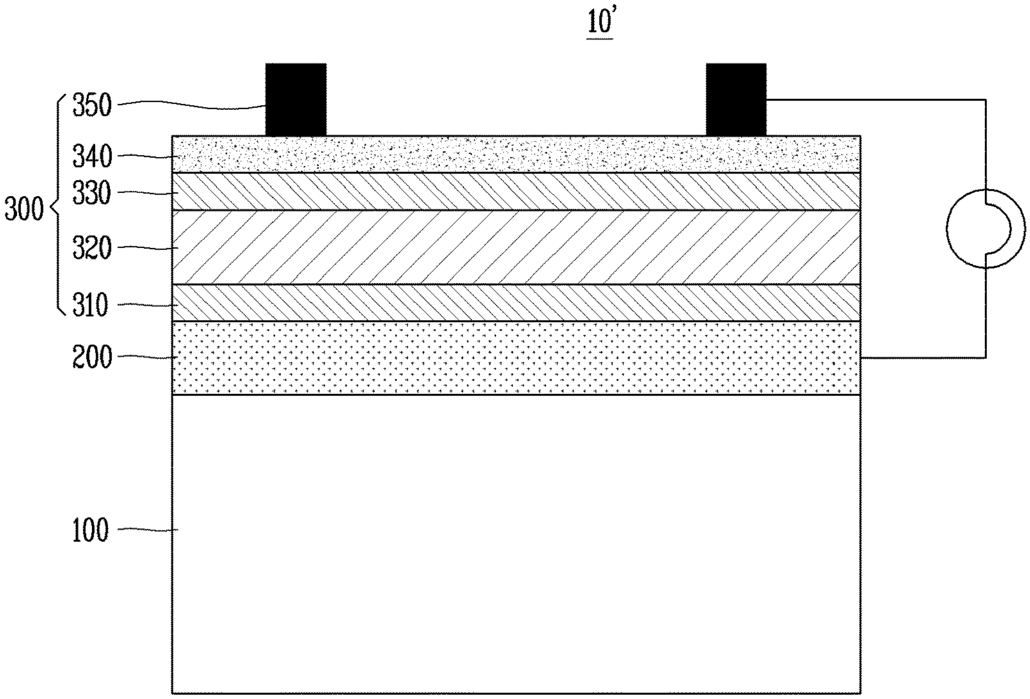
FIGS. 7 and 8 are conceptual views of solar cells manufactured by a method for manufacturing a solar cell of the present disclosure.
Figure 8:
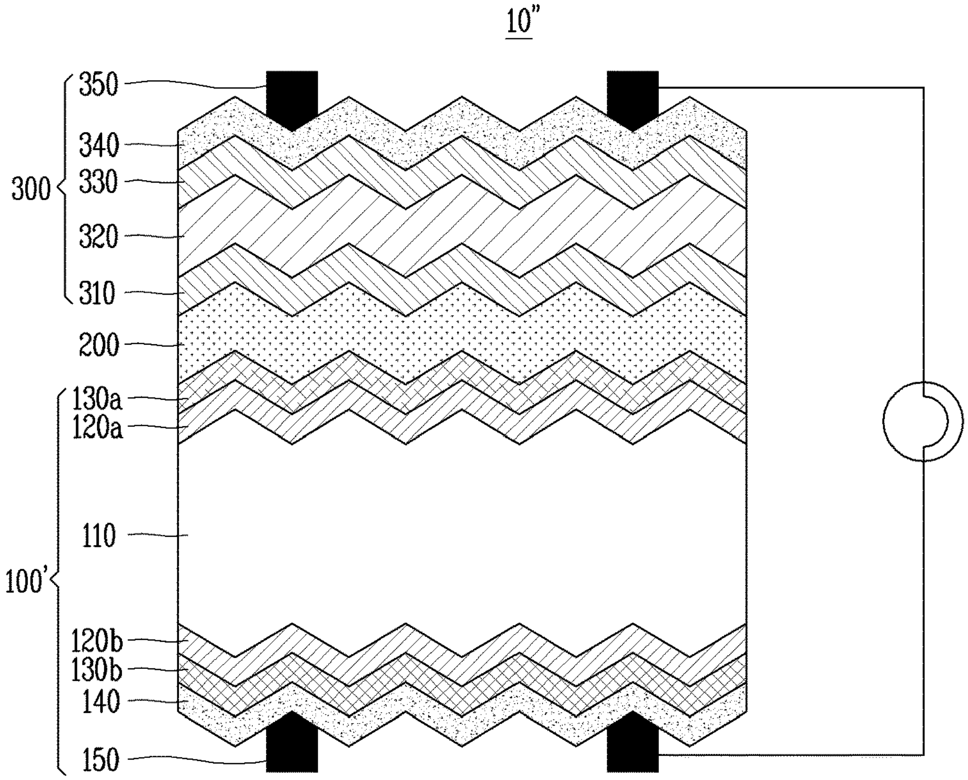

FIGS. 7 and 8 are conceptual views of solar cells 10' and 10" manufactured by a method for manufacturing a solar cell of the present disclosure.

Referring to FIG. 7, the solar cell 10' includes the adhesive layer 200 and the perovskite solar cell 300 sequentially stacked on a front surface of the substrate 100. Here, in the solar cell 10', the adhesive layer 200 and the fourth electrode layer 350 may be connected to each other to form a circuit. In other words, the fourth electrode layer 350 may act as a front electrode of the solar cell 10', and the adhesive layer 200 may act as a rear electrode of the solar cell 10'.

Referring to FIG. 8, the solar cell 10" may use the photoelectric transducer 100' including the amorphous semiconductor layer as a substrate. The solar cell 10" includes the adhesive layer 200 and the perovskite solar cell 300 sequentially stacked on a front surface of the photoelectric transducer 100'.

Thus, in particular, when the semiconductor substrate 110 of the photoelectric transducer 100' is a silicon semiconductor substrate, the solar cell 10" may be implemented as a monolithic tandem solar cell formed by laminating and bonding the perovskite solar cell 300 on a front surface of the silicon solar cell. In other words, the solar cell 10" may be implemented as a perovskite/silicon tandem solar cell.

Here, the solar cell 10" absorbs light in a short wavelength region at a front surface thereof and absorbs light in a long wavelength region at a rear surface thereof to move a threshold wavelength toward the long wavelength, and thus an entire absorption wavelength region is widely used. Accordingly, light conversion efficiency of the solar cell 10" may be improved.

Meanwhile, in the solar cell 10", the perovskite solar cell 300 and the photoelectric transducer 100' are tunnel-joined with the adhesive layer 200 interposed therebetween. Accordingly, in the solar cell 10", the fourth electrode layer 350 on the front surface and the second electrode layer 150 on the rear surface may be connected to each other to form a circuit. In other words, the fourth electrode layer 350 may act as a front electrode of the solar cell 10", and the second electrode layer 150 may act as a rear electrode of the solar cell 10".

Figure 9:
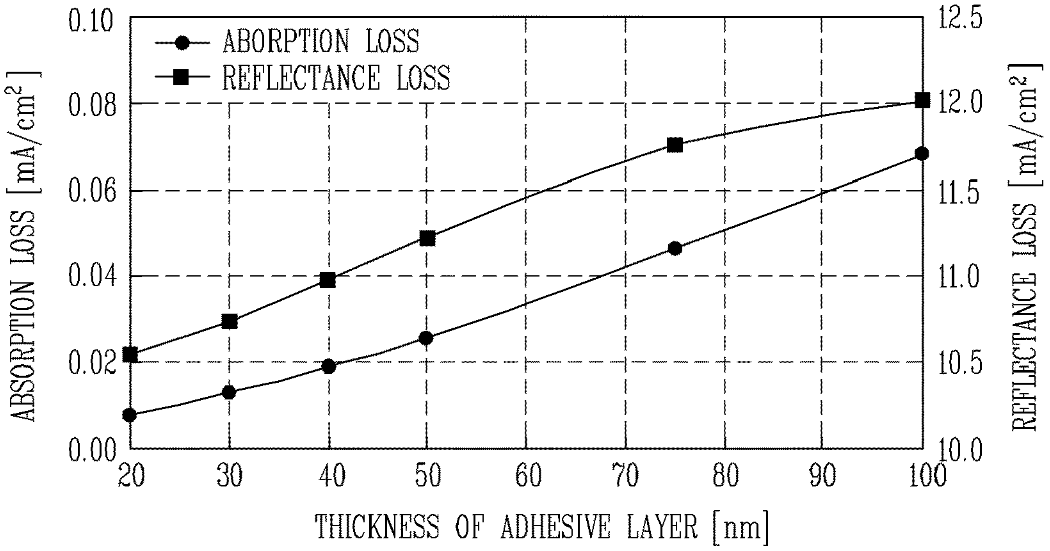
FIGS. 9 and 10 are analysis results of optical loss and electrical conductivity according to a thickness of an adhesive layer of the present disclosure.
Figure 10:
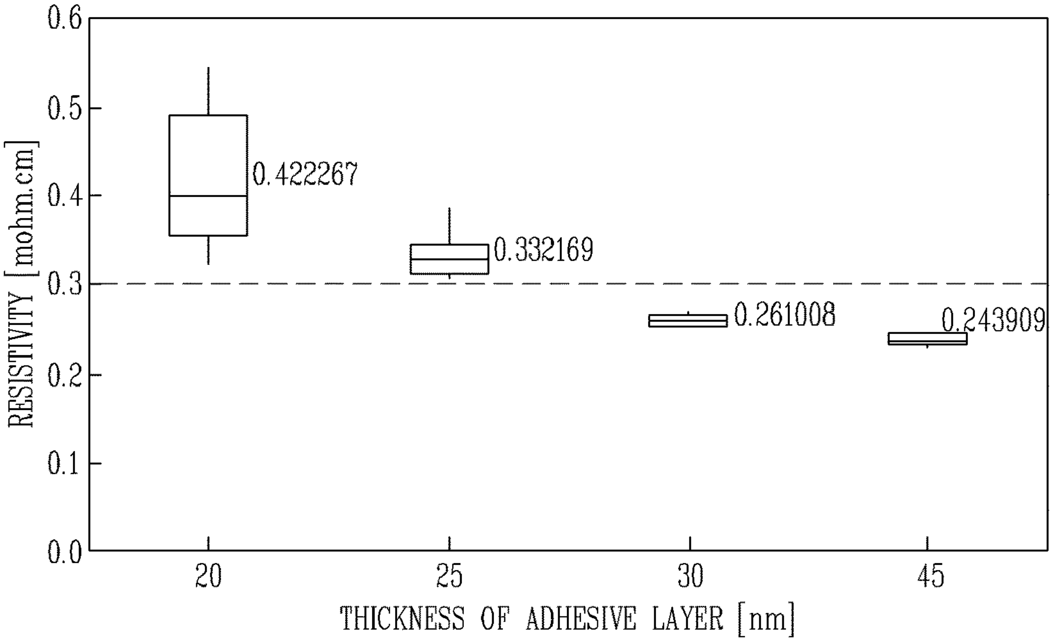

FIGS. 9 and 10 are analysis results of optical loss and electrical conductivity according to a thickness of an adhesive layer of the present disclosure.

Referring to FIG. 9, as the thickness of the adhesive layer increases, a loss of short-circuit current density Jsc generated by light absorbed in the adhesive layer increases. In addition, as the thickness of the adhesive layer increases, a loss of short-circuit current density Jsc generated by light reflected from the adhesive layer also increases. In other words, when the thickness of the adhesive layer increases, optical loss increases while the solar cell is operating.

Meanwhile, referring to FIG. 10, a resistivity of the adhesive layer decreases as the thickness of the adhesive layer increases. When the adhesive layer with a decreased resistivity is applied to the solar cell, carriers are smoothly moved thereby reducing electrical loss when the solar cell is operating.

In other words, an increase in the thickness of the adhesive layer of the present disclosure causes optical loss but acts as a factor for reducing electrical loss, and thus has a trade-off. Accordingly, referring to simulation results in Table 1 below, an optimum point of the thickness of the adhesive layer may be derived by comparing an electrical property and an optical property of the adhesive layer.

TABLE 1

| Thickness of adhesive layer [nm] | Resistivity [mohm-cm] | AWA350-1200 nm [%] | Mobility [cm2/Vs] |
|---|---|---|---|
| 13 | 0.33 | 0 | 84.3 |
| 33 | 0.3 | 0 | 108.2 |
| 44 | 0.24 | 0.01 | 108.5 |
| 55 | 0.25 | 0.12 | 101.9 |
| 113 | 0.23 | 0.1 | 109.1 |

Referring to FIGS. 9, 10, and Table 1, it can be seen that when the thickness of the adhesive layer is in a range of 20 to 40 nm, an optimum point in which an electrical property and an optical property are considered can be derived. When the thickness of the adhesive layer is less than 20 nm, the adhesive layer does not have sufficient electrical conductivity, and thus it is not easy to collect electrons generated in the solar cell in the present disclosure. On the other hand, when the thickness of the adhesive layer exceeds 40 nm, it has sufficient electrical conductivity, but significant optical loss occurs in the adhesive layer.

The method for manufacturing the solar cell described above is not limited to the configurations and the methods of the embodiments described above, but the embodiments may be configured by selectively combining all or part of the embodiments so that various modifications or changes can be made.

The invention claimed is:

1. A method for manufacturing a solar cell, the method comprising:

providing a substrate, wherein the substrate comprises a photoelectric transducer with:

a semiconductor substrate;

a first conductive type semiconductor layer disposed on a first surface of the semiconductor substrate; and a second conductive type semiconductor layer disposed on a second surface of the semiconductor substrate, wherein at least one of the first conductive type semiconductor layer or the second conductive type semiconductor layer comprises an amorphous semiconductor layer;

performing a first optical treatment on the amorphous semiconductor layer to improve saturation current density and a first heat treatment to increase effects of the first optical treatment on the amorphous semiconductor layer;

forming an adhesive layer in a pattern on the substrate to reduce loss of light incident on the adhesive layer;

forming, on the adhesive layer, a perovskite solar cell comprising a perovskite absorption layer; and performing a second optical treatment on the perovskite solar cell to improve conductivity and a second heat treatment on the perovskite solar cell to increase effects of the second optical treatment, wherein the first heat treatment is in a temperature range of 200° C. to 300° C. and the second heat treatment is in a temperature range of 100° C. to 200° C.

2. The method of claim 1, wherein the first optical treatment is performed by a light source, wherein the light source comprises at least one of a xenon lamp, a halogen lamp, a laser, a plasma lighting system (PLS), or a light emitting diode (LED).

3. The method of claim 1, wherein the first optical treatment is performed by a light source, wherein the light source is spaced apart from the substrate by a distance in a range from 485 to 518 mm, a light amount of the light being in a range from 100 to 800 $W/m^2$.

4. The method of claim 1, wherein the first optical treatment is performed for 5 to 30 minutes.

5. The method of claim 1, further comprising providing a tunneling film at each of the first surface of the semiconductor substrate and the second surface of the semiconductor substrate, and wherein the tunneling film comprises at least one of an i-type amorphous semiconductor layer, an amorphous silicon carbide layer, an amorphous silicon nitride layer, or an amorphous silicon oxide layer.

6. The method of claim 1, wherein the adhesive layer comprises at least one of a transparent conductive oxide material, a carbonaceous conductive material, a metallic material, or a conductive polymer material.

7. The method of claim 6, wherein a thickness of the adhesive layer is in a range from 20 to 40 nm.

8. A solar cell manufactured by the method of claim 1.

* * * * *